United States Patent
Aid et al.

(10) Patent No.: US 8,460,987 B2
(45) Date of Patent: Jun. 11, 2013

(54) METHOD FOR OBTAINING A LAYER OF ALN HAVING SUBSTANTIALLY VERTICAL SIDES

(75) Inventors: Marc Aid, Grenoble (FR); Emmanuel Defay, Voreppe (FR); Aude Lefevre, Froges (FR); Guy-Michel Parat, Claix (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/097,686

(22) Filed: Apr. 29, 2011

(65) Prior Publication Data

US 2011/0266594 A1 Nov. 3, 2011

(30) Foreign Application Priority Data

Apr. 30, 2010 (FR) ...................................... 10 53360

(51) Int. Cl.
*H01L 21/20* (2006.01)
(52) U.S. Cl.
USPC ............. 438/183; 438/778; 438/478; 438/50; 257/E21.09
(58) Field of Classification Search
None
See application file for complete search history.

(56) References Cited

U.S. PATENT DOCUMENTS

| | | | | |
|---|---|---|---|---|
| 6,415,507 B1 * | 7/2002 | Shimosato et al. | .......... | 29/890.1 |
| 7,791,432 B2 * | 9/2010 | Piazza et al. | .................. | 333/186 |
| 7,915,974 B2 * | 3/2011 | Piazza et al. | .................. | 333/186 |
| 7,958,608 B2 * | 6/2011 | Fujii et al. | .................... | 29/25.35 |
| 8,028,389 B2 * | 10/2011 | Chen et al. | ................... | 29/25.35 |
| 2006/0046319 A1 | 3/2006 | Takeda | | |
| 2007/0139140 A1 * | 6/2007 | Rao et al. | ....................... | 333/188 |
| 2009/0108959 A1 * | 4/2009 | Piazza et al. | .................. | 333/189 |

FOREIGN PATENT DOCUMENTS

| | | |
|---|---|---|
| JP | 2002-240271 | 8/2002 |
| JP | 2002240271 A * | 8/2002 |

OTHER PUBLICATIONS

Piazza, G.; Stephanou, P.J.; Pisano, A.P.; , "Piezoelectric Aluminum Nitride Vibrating Contour-Mode MEMS Resonators," Microelectromechanical Systems, Journal of , vol. 15, No. 6, pp. 1406-1418, Dec. 2006.*
Kim, J. H., and S. I. Woo. "Chemical Dry Etching of Platinum Using Cl/CO Gas Mixture." Chemistry of Materials 10.11 (1998): 3576-582.*
Saravanan, S. and Berenschot, Erwin and Krijnen, Gijs and Elwenspoek, Miko (2004) Surface Micromachining Process for the Integration of AlN Piezoelectric Microstructures. In: SAFE 2004, 7th Annual Workshop on Semiconductor Advances for Future Electronics, Nov. 25-26, 2004, Veldhoven, the Netherlands.*

(Continued)

*Primary Examiner* — Thomas L Dickey
*Assistant Examiner* — Joseph Schoenholtz
(74) *Attorney, Agent, or Firm* — Oblon, Spivak, McClelland, Maier & Neustadt, L.L.P.

(57) ABSTRACT

A method for producing a layer of AlN having substantially vertical sides relative to the surface of a substrate, including: the formation of an AlN growth layer on a substrate, the deposition of the AlN layer, on at least said growth layer, the formation of a mask layer over the AlN layer, at least one edge of which is aligned with at least one edge or side of the growth layer, in a plane which is substantially perpendicular to a surface of the substrate or a surface of the growth layer, and the etching of the AlN layer.

18 Claims, 4 Drawing Sheets

OTHER PUBLICATIONS

Mahameed, Rashed, Nipun Sinha, Marcelo B. Pisani, and Gianluca Piazza. "Dual-beam Actuation of Piezoelectric AlN RF MEMS Switches Monolithically Integrated with AlN Contour-mode Resonators." Journal of Micromechanics and Microengineering 18.10 (2008): 105011.*

Chen, D., D. Xu, J. Wang, B. Zhao, and Y. Zhang. "Dry Etching of AlN Films Using the Plasma Generated by Fluoride." Vacuum 83.2 (2008): 282-85.*

Khan, F. A. "High Rate Etching of AlN Using BCl3/Cl2/Ar Inductively Coupled Plasma." Materials Science and Engineering B95 (2002): 51-54.*

Cheng, Chen Y. "A Monolithic Thermal Inkjet Printhead Combining Anisotropic Etching and Electroplating." Input/Output and Imaging Technologies II, Proceedings of SPIE 4080 (2000): 246-52.*

Nipun Sinha, Rashed Mahameed, Chengjie Zuo, and Gianluca Piazza. "Integration of AlN Micromechanical Contour-Mode Technology Filters with Three-Finger Dual Beam AlN MEMS Switches" 2009 Joint Meeting of the European Frequency and Time Forum and the IEEE International Frequency Control Symposium (EFTF-IFCS 2009) (2009): 1-4.*

Piezoelectric aluminum nitride nanoelectromechanical actuators Nipun Sinha, Graham E. Wabiszewski, Rashed Mahameed, Valery V. Felmetsger, Shawn M. Tanner, Robert W. Carpick, and Gianluca Piazza, Appl. Phys. Lett. 95, 053106 (2009).*

Machine Translation of JP 2002 240271.*

French Preliminary Search Report issued Feb. 3, 2011 in patent application No. 1053360 with English Translation of Category of Cited Documents.

Gianluca Piazza, et al., "Piezoelectric Aluminum Nitride Vibrating Contour-Mode MEMS Resonators", Journal of Microelectromechanical Systems, vol. 15, No. 6, XP011151359, Dec. 1, 2006, pp. 1406-1418.

A. Ababneh, et al., "Etching behaviour of sputter-deposited aluminium nitride thin films in $H_3PO_4$ and KOH solutions", Microsyst Technol, vol. 14, No. 4-5, XP002620193, Apr. 30, 2008, pp. 567-573.

M. Bickermann, et al., "Wet KOH etching of freestanding AlN single crystals", Journal of Crystal Growth 300, 2007, pp. 259-307.

S. Saravanan, et al., "Surface Micromachining Process for the Integration of AlN Piezoelectric Microstructures", 7th Annual Workshop on Semiconductor Advances for Future Electronics, Nov. 25-26, 2004, pp. 676-681.

F.A. Khan, et al., "High rate etching of AlN using $BCl_3/Cl_2$/Ar inductively coupled plasma", Materials Science & Engineering B95, 2002, pp. 51-54.

C.D. White, et al., "Design of nano-gap piezoelectric resonators for mechanical RF magnetic field modulation", Sensors and Actuators A 134, 2007, pp. 239-244.

* cited by examiner

METHOD FOR OBTAINING A LAYER OF ALN HAVING SUBSTANTIALLY VERTICAL SIDES

TECHNICAL FIELD AND PRIOR ART

The invention relates to techniques for etching a material such as AlN, with a view to producing a layer of this material with one or more square sides, i.e., substantially perpendicular to a surface on which this layer is deposited or formed. "Substantially perpendicular" is understood to mean the fact that the side forms an angle with said surface which is greater than or equal to 75°.

This type of material is used in the production of MEMS components, e.g., of the type requiring a piezoelectric or dielectric layer having square sides.

Use has likewise been made of same in preparing acoustic resonators. Such a resonator comprises a piezoelectric layer which must have one or more vertical sides, so as to prevent spurious wave propagation.

Finally, this type of material is also used in the production of capacitive sensing MEMS, which require fine vertical "gaps", or else in the production of gyroscopes.

The article by G. Piazza, which was published in the Journal of Microelectromechanical Systems, volume 15, number 6, pages 1406-1418, entitled "Piezoelectric Aluminium Nitride Vibrating Contour-Mode MEMS Resonators", 2006, describes, in particular, the use of AlN in a MEMS resonator.

However, at the present time, no technique is known for enabling AlN to be etched with square sides.

Dry or wet etching techniques are all of an isotropic nature. They result in one or more sides not having the desired verticality: the material is indeed then etched in a vertical direction, but also in a horizontal direction.

The problem therefore arises of finding a technique for producing a layer of AlN with a square side, i.e., substantially perpendicular to a substrate on which the layer is produced.

DISCLOSURE OF THE INVENTION

The invention first of all relates to a method for producing a layer of AlN having at least one side which is substantially vertical or perpendicular relative to a surface of a substrate, the surface of said substrate having a topology comprising at least one step-type pattern, said method comprising:
  the deposition of the AlN layer, on at least said pattern of the topology, and on at least a portion without any topology,
  the formation of a mask layer over the AlN layer, at least one edge of which is positioned in the vicinity of at least one edge or side of the step of the pattern, or aligned with at least one edge or side of said step, in a plane which is substantially perpendicular to the surface of the substrate,
  the etching of the AlN layer through the mask.

"Substantially vertical or perpendicular" is understood to mean the fact that the side forms an angle with said surface which is greater than or equal to 75°.

Such a method can comprise a preliminary step for forming the topology of the substrate, by etching the surface of the substrate, so as to at least obtain the step-type pattern.

The step can have at least one lateral side forming an angle less than or equal to 15° relative to the perpendicular to the surface of the substrate in or on which same is made.

According to one particular embodiment, the substrate comprises a sub-layer, one surface of which, together with the surface of the substrate, forms the step-type pattern. This sub-layer can be obtained by depositing a uniform layer of material, and by then etching at least said layer, in order to obtain the step-type pattern.

At least a portion of the sub-layer and/or at least a portion of the mask layer can form an electrode.

The sub-layer can be made of titanium (Ti) or silicon (Si), or molybdenum (Mo), or platinum (Pt), or silicon nitride.

The topology or step-type pattern or the sub-layer can have a thickness of between 10 nm and 1 µm.

The mask layer can be made of silica ($SiO_2$), or molybdenum (Mo), or platinum (Pt) or an adhesive resin. It has a thickness, for example, of between 10 nm and 10 µm.

A method according to the invention can further comprise the production of an inclined side by etching the AlN layer.

The etching of the AlN layer is preferably a wet etching operation.

A method according to the invention can further enable at least one hole having vertical edges to be produced, the diameter of the hole and the thickness of the AlN layer preferably having a diameter/thickness ratio less than 0.5.

The invention likewise relates to a heterogeneous substrate having an AlN layer, comprising:
  a support substrate, one surface of which has a topology comprising at least one step-type pattern,
  a layer of AlN, covering said pattern, at least one side of this layer of AlN being positioned in the vicinity of at least one edge of the step-pattern, in a plane which is substantially perpendicular to said surface of the substrate.

The topology can result from etching the surface of the substrate so as to obtain at least the step-type pattern.

The step can have at least one lateral side forming an angle less than or equal to 15° relative to the perpendicular to the surface of the substrate in or on which same is made.

The substrate can comprise a sub-layer, one surface of which, together with the surface of the substrate, forms the step-type pattern.

The sub-layer can be at least partially formed on a layer forming a surface topology of the support substrate.

A substrate according to the invention can further comprise at least one hole having vertical edges, the ratio between the diameter of said hole and the thickness of the AlN layer preferably being less than or equal to 0.5.

DETAILED DISCLOSURE OF EMBODIMENTS OF THE INVENTION

A first embodiment of the invention will be described in connection with FIGS. 1A to 1D.

Figure 1A:
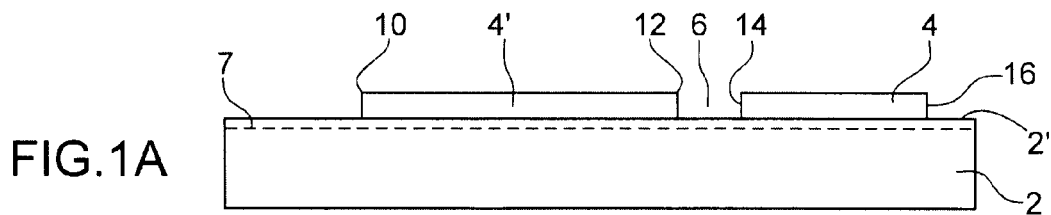
FIGS. 1A to 1D show steps of a method according to the invention.
Figure 1B:
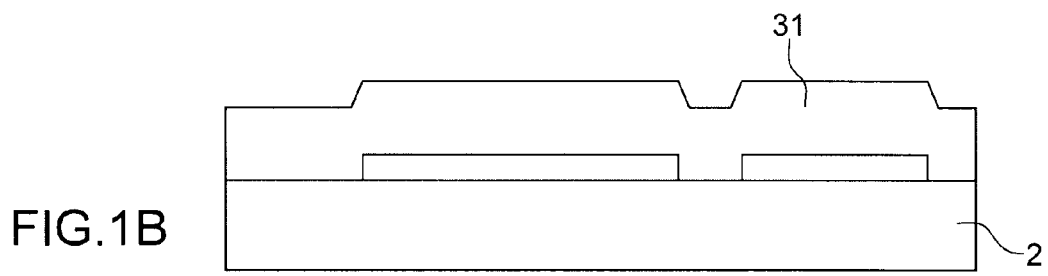

A layer 4, which can be continuous or connected, but which is not necessarily so, is formed, by deposition, for example, on a substrate 2, which is made, for example, of silicon or sapphire: in the example of FIG. 1A, this layer comprises a first portion 4 which is separated from a second portion 4' by an opening 6, which exposes the surface 2' of the substrate 2.

This opening, for example, is obtained by etching portions 4, 4' in an initial continuous layer of the material in which portions 4, 4' are made, which etching stops on the surface 2' of the substrate 2. References 12 and 14 designate the sides of portions 4' and 4 of this layer, respectively, which are on either side of the opening 6. Two other sides are designated by references 10 and 12, on the left and right of FIG. 1A.

In other words, said layer 4, 4', as well as the topology 4a, 4'a, 4b formed in the embodiments of FIGS. 5A-5D and 6A-6D, is bordered or surrounded by a surface 2' of the substrate, which is situated at a lower level relative to the upper level or elevated portion of layer 4, 4' or of the topology 4a, 4'a, 4b. The wording "topology" means variations in height or level according to a direction perpendicular to a plane defined by the surface 2'.

Figure 2A:
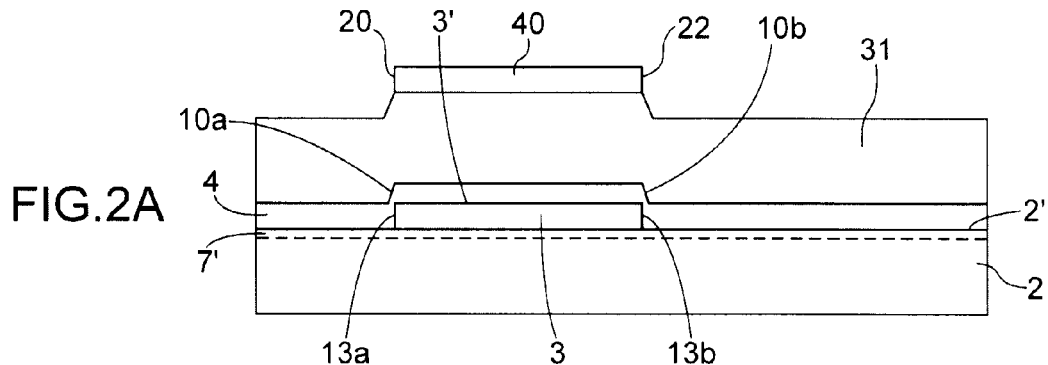
FIGS. 2A and 2B show an alternative of a method according to the invention.
Figure 2B:
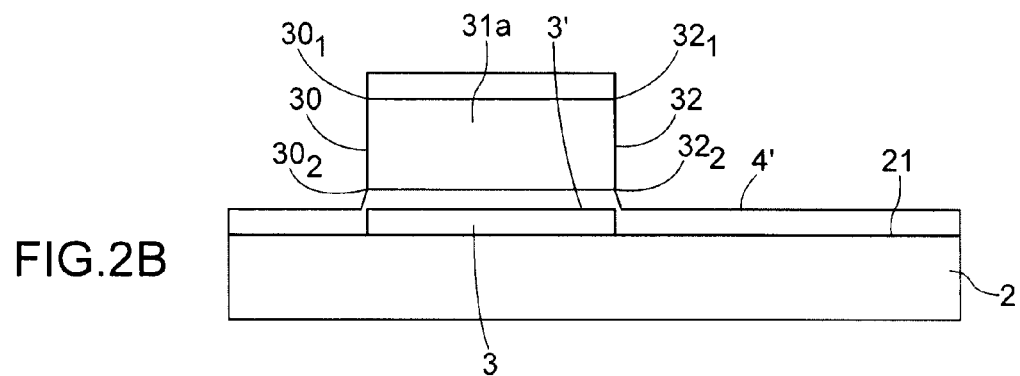

In the case of FIGS. 2A-2B, it is an elevated portion of layer 4 (the portion of this layer which is on layer 3) which is bordered or surrounded by a non-elevated portion of this same layer 4 (the portion of this layer 4 which directly on the substrate 2).

All of said sides 10, 12, 14, 16 are square, i.e., substantially perpendicular to the surface 2' of the substrate 2, or form an angle less than or equal to 15° with the perpendicular to said surface.

The material of layer 4, 4', for example, is titanium (Ti) or silicon (Si), or molybdenum (Mo), or platinum (Pt), or silicon nitride (SiN or $Si_3N_4$) or else silicon oxide ($SiO_2$).

This layer 4, 4' can have a thickness of the order of 200 nm, or, more generally speaking, between 10 nm and 1 μm or else between 100 nm and 300 nm.

At least a portion of this layer 4, 4' can form an electrode.

Optionally, a texturing or germinating layer 7, which will enable assistance in orienting the material 31 to then be deposited, may have been pre-formed on the surface of the substrate 2.

A layer 31 of AlN is next deposited (FIG. 1B), which, for example, has a thickness equal to approximately 1 μm or, more generally speaking, between 10 nm and 5 μm. A deposition technique capable of being used is the PVD ("Physical Vapour Deposition") technique.

This layer 31 is deposited uniformly over portions 4, 4' of the previously obtained layer (also referred to as the sub-layer or topology layer), as well as over the portions of the surface 2' of the substrate 2 which are exposed, or else on both the lower level defined by layer 4, 4' on surface 2' and on the upper level or on the elevated portion of layer 4, 4' (or the topology 4a, 4'a, 4b in the other FIGS. 5A-6D).

Next (FIG. 1C) a step is carried out on layer 31 for producing a hard mask 40, 40', the edges 20, 22, 24 of which are aligned with the edges 10, 12, of the sub-layer 4. 4'. Here again, one or more portions of this mask can form an electrode, e.g., of a device not shown in the figures.

In other words, these edges 20, 22, 24, together with each of the edges 10, 12, 14 of layer 4, 4', respectively, define a plane which is substantially perpendicular to the surface 2' of the substrate 2. In fact, this plane may not be strictly perpendicular to surface 2', but slightly inclined in relation to the perpendicular direction, e.g., by an angle of between 0° and 15°. This mask layer 40, 40' has a thickness which, for example, can be between 10 nm and 10 μm. For example, it can be made of molybdenum (Mo) or silicon nitride (SiN, $Si_3N_4$).

The alignment of the edges 20, 22, 24 with each of the edges 10, 12, 14, respectively, can be obtained with an accuracy of the order of one μm or less than 1 μm, e.g., an accuracy of ±1 μm on a 1× stepper, ±150 nm for deep UV lithographs and ±50 nm for e-beam lithographs.

This alignment will enable a top end $30_1$, $32_1$, $34_1$ and a bottom end $30_2$, $32_2$, $34_2$ of sides 30, 32, 34 to be defined, which will be made in layer 31.

The edges of the mask 40, 40' will define the top ends $30_1$, $32_1$, $34_1$ of the sides being etched (in other words, said top ends are positioned where the edges of the mask are positioned).

In the same way, the edges of layer 4, 4' will define the bottom ends $30_2$, $32_2$, $34_2$ of the sides being etched (in other words, said bottom ends are positioned where the edges of said layer are positioned).

Figure 1C:
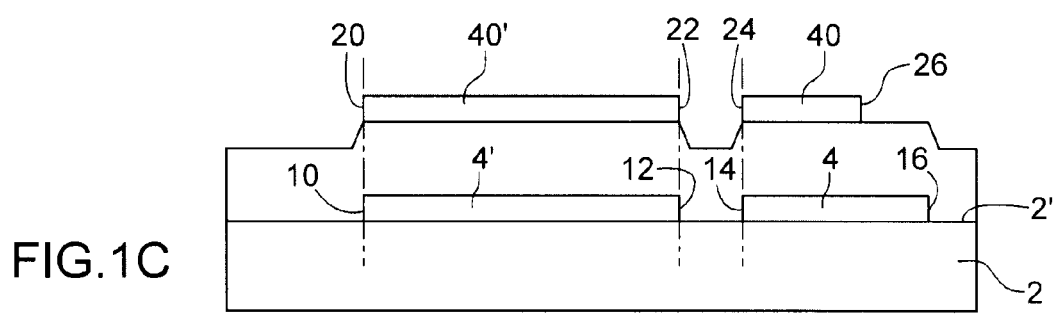

In this example, and as seen in FIG. 1C, one of the sides of the mask 40, in this case the square side 26, is not aligned with the square side 16 of the sub-layer 4.

Figure 1D:
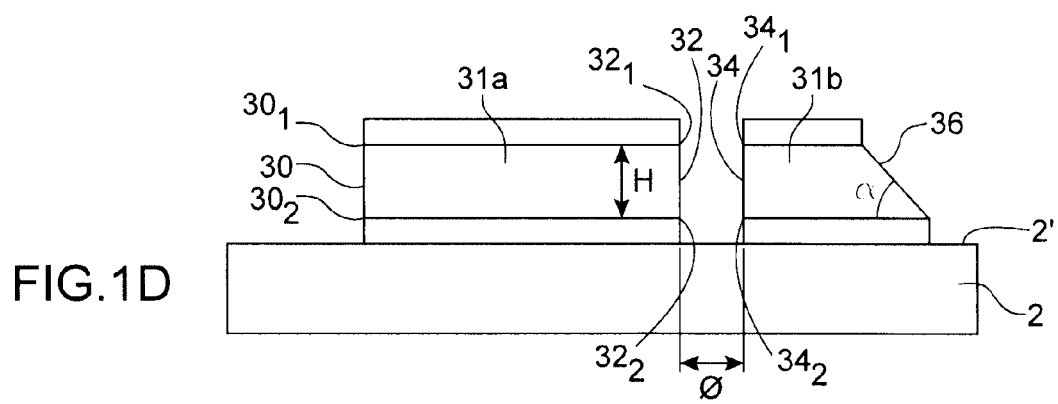

An etching step is carried out next, as shown in FIG. 1D. This step will enable the layer 31 of AlN material to be etched in areas which are not protected by the mask 40, 40'. This etching is continued as far as the surface 2' of the substrate 2; said surface 2' therefore reappears after the etching has been completed.

The slope of each side, which extends between a top end $30_1$, $32_1$, $34_1$ and a bottom end $30_2$, $32_2$, $34_2$, is defined by the corresponding top and bottom end pair $30_1$, $32_1$, $34_1$ and $30_2$, $32_2$, $34_2$.

Due to the alignment conditions of the edges of the mask 40, 40' with those of the sub-layer 4, 4', sides 30, 32, 34 of layer 31 are obtained, which are aligned with the corresponding sides of the sub-layer 4, 4' and of the mask layer 40, 40'.

In other words, said sides 30, 32, 34 of the AlN layer 31 are perpendicular to the surface 2' of the substrate 2, or the angle thereof relative to said perpendicular is less than a few degrees, e.g., less than +15°.

In the example which has been shown in the drawings, the etching operation results in the formation of a hole 60, between two portions 31a, 31b of AlN, which are situated beneath the hard mask portions 40, 40'.

The walls of this hole are the sides 32, 34 which, as indicated above, are perpendicular to the surface 2' of layer 2. Using this technique, it is possible to obtain a hole of approximately 10 μm in diameter Ø, more generally speaking between 100 nm and 100 μm and/or a hole which passes through layer 31, and of which the ratio of the diameter Ø to the thickness H of the layer is less than or equal to approximately ½ (Ø/H≦0.5).

As already indicated above, the square side 26 of the mask layer 40 is not aligned with the square side 16 of the growth layer 4.

This therefore results in one side 36 of layer 31b which is not perpendicular to the surface 2' of the substrate 2, but which, together with said surface 2', defines an angle α.

Another embodiment will now be explained in connection with FIGS. 2A and 2B.

In these figures, starting with a substrate 2 identical to the one described previously, a layer 3 of thickness e is first formed, with a view to creating a topology in the future sub-layer 4 (or, here again, a topology layer).

This layer 3, for example, can be a layer used to define an electrode. For example, it can be made of $SiO_2$ or SiN or molybdenum (Mo) or platinum (Pt). Its thickness e, for example, is between 10 nm and 1 μm, or between 100 nm and 300 nm.

As in the first embodiment, a texturing sub-layer 7' can be made in advance. This sub-layer then textures layer 3, which itself textures layer 31.

Figure 3:
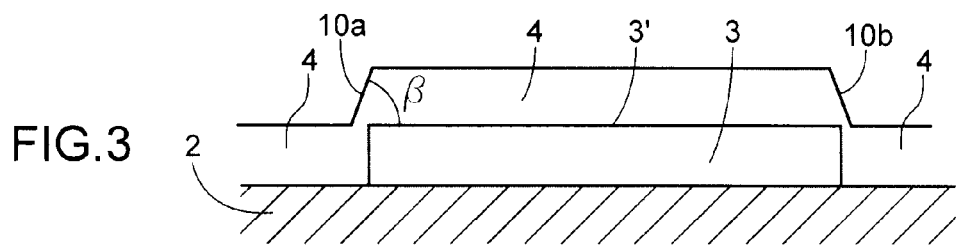
FIG. 3 shows an enlargement of a portion of a substrate, on which the alternative of FIGS. 2A and 2B can be implemented.

Next, a layer 4 is deposited, the nature and thickness of which can be those already mentioned for the first embodiment. Therefore, after this deposition, a layer 4 is obtained, a portion of which rests directly on the surface 2' of the substrate 2, and another portion of which rests on the surface 3' of layer 3. In the deposited layer 4, the edges 13a, 13b of layer 3 result in sides 10a, 10b, which can be slightly inclined in relation to a direction perpendicular to the surface 2'. This aspect is shown in greater detail in FIG. 3, where it is seen that side 10a, together with a horizontal plane (reference is made here to surface 3' of layer 3), defines an angle β which can be of the order of 80° or more.

Here again, a step was produced in layer 4, having a height substantially equal to the thickness e of layer 3. The edges of this step are not necessarily strictly perpendicular to the surface 2' of the substrate 2. The step is defined both by the lower level defined by the upper surface of layer 4, in the area where there is no underlying pattern 3, and the upper level or elevated portion of this same layer 4.

Next, once again using the PVD technique, for example, the layer 31 of AlN is deposited, on the surface of said layer 4, in the non-elevated portions thereof, but also on the surface of said layer 4, in the portion which is elevated due to the presence of the pattern 3.

Then, a mask layer 40 is once again formed, the sides 20, 22 of which are aligned—as defined and in the way already explained above—with the sides 13a, 13b of layer 3 and the sides 10a, 10b of layer 4. This alignment will enable a top end $30_1$, $32_1$ and a bottom end $30_2$, $32_2$ of sides 30, 32 to be defined, which will be made in layer 31.

The edges of the mask 40 will define the top ends $30_1$, $32_1$ of the sides being etched to be defined (in other words, said top ends are positioned where the edges of the mask are positioned).

In the same way, the edges of the elevated portion of layer 4 will define the bottom ends $30_2$, $32_2$ of the sides being etched (in other words, said bottom ends are positioned where the edges of the elevated portion of said layer are positioned).

This mask layer can form one or more electrodes.

Next, (FIG. 2B), layer 31 is etched, which results in the formation of sides 30, 32 of said layer 31. These sides are perpendicular to the surface 3' of layer 3 or to the surface 4' of layer 4, due to the alignment that was just mentioned.

The slope of each side, which extends between a top end $30_1$, $32_1$ and a bottom end $30_2$, $32_2$, is defined by the corresponding top and bottom end pair $30_1$, $32_1$ and $30_2$, $32_2$.

In this second embodiment, the thicknesses and materials for layers 4, 31, 40 can be identical or similar to the thicknesses and materials indicated above, within the context of the first embodiment. As for layer 3, for example, it can be made of silicon dioxide ($SiO_2$), or silicon nitride (SiN), or molybdenum (Mo), or platinum (Pt) and, like the sub-layer 4, have a thickness which can be between 10 nm and 1 μm.

According to this second embodiment, layer 4 is not necessarily etched, but a topology, or a step, or a raised surface is created at the surface of said sub-layer 4, by previously forming an underlying layer 3 having sides which, when the sub-layer 4 is deposited, will likewise result in sides 10a, 10b.

Next, layer 31 is etched, in the areas not situated beneath the mask layer 40. As before, layer 31 is etched over the entire thickness thereof, but the surface 4' of the sub-layer 4 is then exposed.

Therefore, a portion 31a made of AlN is obtained, with lateral sides 30, 32 which, once again, it is observed are perpendicular to the horizontal surface here defined by the upper surface 4' of sub-layer 4.

In other words, it is possible to use layer 3 to form a topology or raised surface in sub-layer 4, the edges 10a, 10b of which will in turn enable the edges of the mask layer 40 to be aligned, and to define the areas in which, after etching, vertical sides of layer 31 will be obtained.

In this second embodiment, one or more holes can also be produced, like hole 60 of FIG. 1D, with vertical sides and with the geometric characteristics already mentioned above. To accomplish this, for example, the shape of the topology of the sub-layer 4 and the shape of the mask 40 can be configured as in FIG. 1C. To that end, the sub-layer 4 can be etched after depositing same on the substrate 2 and on layer 3, and then, after depositing the layer 31 of AlN, a mask 40 can be made, which also has etched areas aligned with the etched area of the sub-layer 4. Here also, it possible to further produce one or more inclined sides, like side 36 of FIG. 1D.

Figure 4:
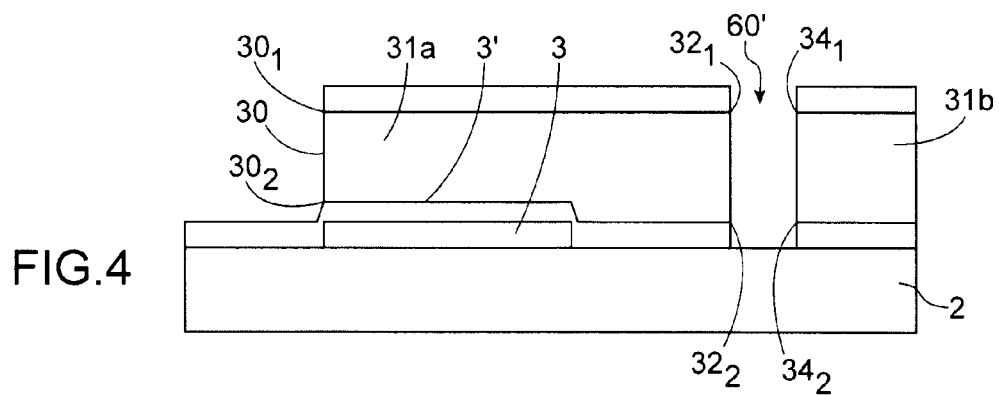
FIG. 4 shows a substrate obtained by combining two embodiments of a method according to the invention.

As shown in FIG. 4, it is possible to combine the two embodiments. Therefore, it is possible to produce a first portion 31a of the layer of AlN on a topology obtained from a layer such as layer 3, and to produce a second portion 31b of the layer of AlN using a topology obtained by etching the portion of the sub-layer 4 deposited directly on the surface 2' of the substrate 2. For example, a hole 60' can be made in this second portion, owing to a preliminary etching of this sub-layer 4. The slope of each side extends between a top end $30_1$, $32_1$, $34_1$ and a bottom end $30_2$, $32_2$, $34_2$ and is defined by the corresponding top and bottom end pair $30_1$, $32_1$, $34_1$ and $30_2$, $32_2$, $34_2$.

Yet another embodiment of the invention will be described in connection with FIGS. 5A to 5D.

A topology is produced on the surface of a substrate 2, e.g., made of silicon or sapphire, and therefore a surface having variations in elevation. Portions 4a, 4'a are therefore elevated (upper level) relative to the rest of the surface 2', which forms the lower level. These portions have edges 10, 12, 14 which are substantially perpendicular to said surface 2'. Alternatively, it is possible to have a single elevated portion, e.g., portion 4' a of FIG. 5A. In other words, the elevated portion can be continuous or connected. Said portions 4a, 4' a can be obtained by etching an initially uniformly planar substrate 2, they can therefore be made of the same material as the substrate 2.

A layer 31 of AlN is next deposited (FIG. 5B), which can have the same characteristics, of thickness, in particular, as those already indicated above, e.g., in connection with FIGS. 1A-1D. The same deposition techniques as those already indicated above can be used. The deposition is carried out on both the lower level defined by surface 2' and on the upper level or on the elevated portion of the topology 4a, 4'a.

Said layer 31 is uniformly deposited on the elevated portions 4a, 4a' of the substrate, as well as on the other portions of the surface 2' of the substrate 2 which are at a lower level.

Next (FIG. 5C), a step is carried out for producing a hard mask 40, 40', on layer 31, the edges 20, 22, 24 of which are aligned with the edges 10, 12, 14 of areas 4a, 4'a. One or more portions of said mask can form an electrode, e.g., of a device not shown in the figures.

This alignment will enable a top end $30_1$, $32_1$, $34_1$ and a bottom end $30_2$, $32_2$, $34_2$ of sides 30, 32, 34 to be defined, which will be made in layer 31.

The edges of the mask 40, 40' will define the top ends $30_1$, $32_1$, $34_1$ of the sides being etched (in other words, said top ends are positioned where the edges of the mask are positioned).

In the same way, the edges of the elevated portions 4a, 4' a will define the bottom ends $30_2$, $32_2$, $34_2$ of the sides being etched (in other words, said bottom ends are positioned where the edges of said elevated portions are positioned).

In other words, said edges 20, 22, 24, together with each of the edges 10, 12, 14, respectively, define a plane which is substantially perpendicular to the surface 2' of the substrate 2. In fact, here again, this plane may not be strictly perpendicular to the surface 2', but can be slightly inclined in relation to the perpendicular direction, e.g., by an angle of between 0° and 15°. This mask layer 40, 40' has a thickness, for example, which can be between 10 nm and 10 μm. For example, it can be made of molybdenum (Mo) or silicon nitride (SiN, $Si_3N_4$).

Only one of the sides shown, the square side 26 of the mask 40, is not aligned with the square side 16 of the topology area 4a.

Figure 5A:
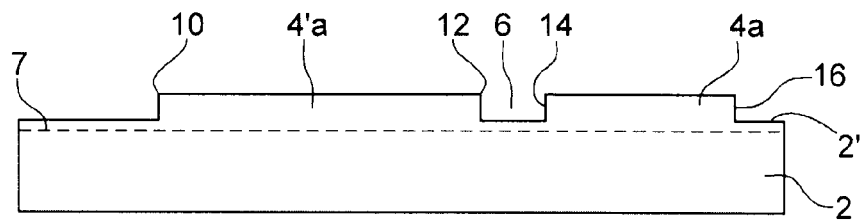
FIGS. 5A-5D show another embodiment of a method according to the invention.
Figure 5B:
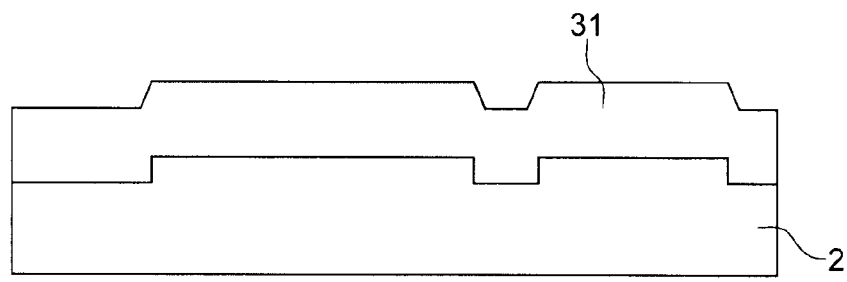
Figure 5C:
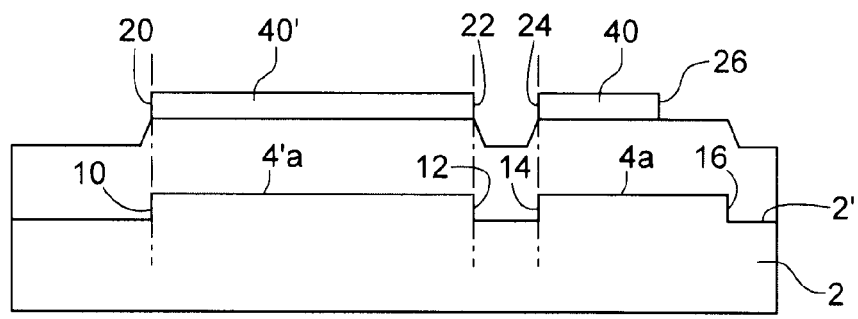
Figure 5D:
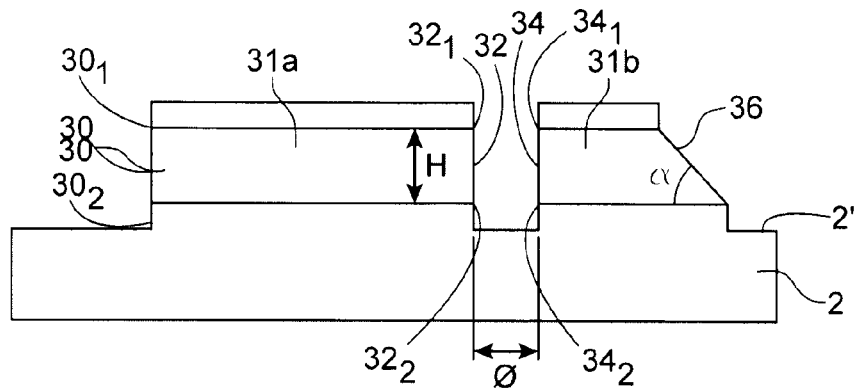

An etching step is next carried out, as shown in FIG. 5D. This step will enable the layer 31 of AlN material to be etched, in areas which are not protected by the mask 40, 40'. This etching is continued as far as the surface 2' of the substrate 2; said surface 2' therefore reappears after the etching has been completed.

The slope of each side, which extends between a top end $30_1$, $32_1$, $34_1$ and a bottom end $30_2$, $32_2$, $34_2$ is defined by the corresponding top and bottom end pair $30_1$, $32_1$, $34_1$ and $30_2$, $32_2$, $34_2$.

Due to the alignment conditions of the edges of the mask 40, 40' with those of the topology 4a, 4'a, sides 30, 32, 34 of layer 31 are obtained, which are aligned with the corresponding sides of the topology 4a, 4'a and of the mask layer 40, 40'.

In other words, said sides 30, 32, 34 of the AlN layer 31 are perpendicular to the surface 2' of the substrate 2, or the angle thereof relative to said perpendicular is less than a few degrees, e.g., less than +15°.

In the example shown, the etching operation results in the formation of a hole 60, between two portions 31a, 31b of AlN, which are situated beneath the hard mask portions 40, 40'.

The walls of this hole are the sides 32, 34 which, as indicated above, are perpendicular to the surface 2' of layer 2. Using this technique, it is possible to obtain a hole of approximately 10 μm in diameter Ø, more generally speaking between 100 nm and 100 μm and/or a hole which passes through layer 31, and of which the ratio of the diameter Ø to the thickness H of the layer is less than or equal to approximately ½.

As already indicated above, the square side 26 of the mask layer 40 is not aligned with the square side 16 of the growth layer 4.

This therefore results in one side 36 of layer 31b which is not perpendicular to the surface 2' of the substrate 2, but which, together with said surface 2', defines an angle α.

According to yet another embodiment of the invention, which will be described in connection with FIGS. 6A to 6D, a topology is produced on the surface of a substrate 2, a topology with a surface which has a step 10, the latter defining a portion 4b which is elevated in relation to the rest of the surface 2'. This configuration can result from the etching of an initially uniformly planar substrate.

Figure 6A:
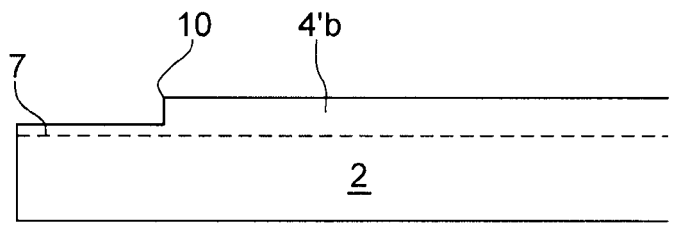
FIGS. 6A-6D show yet another embodiment of a method according to the invention.
Figure 6B:
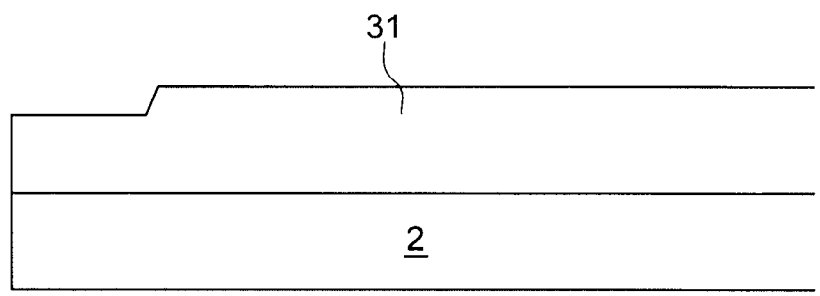
Figure 6C:
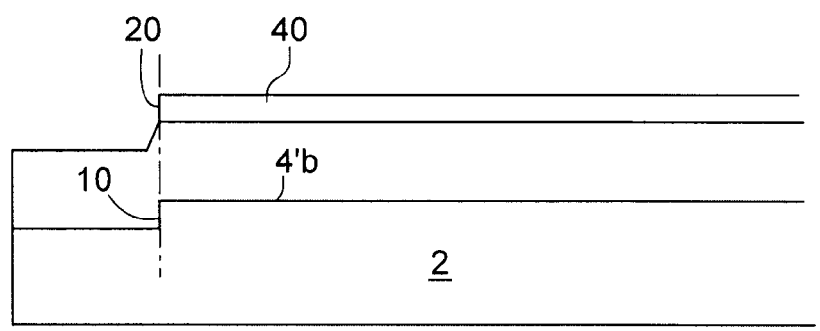
Figure 6D:
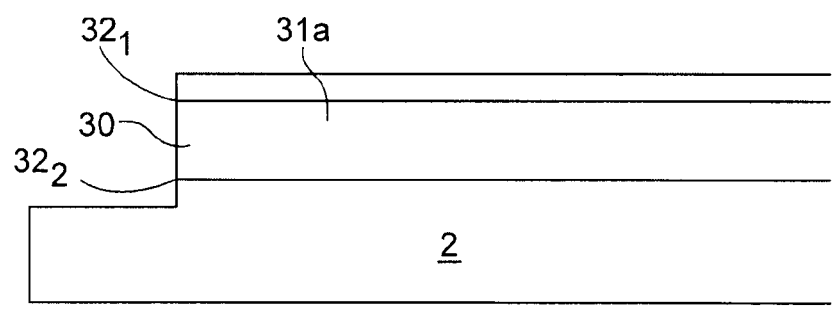

Then, as described above: a layer of AlN 31 (FIG. 6B) is deposited, a mask layer 40 (FIG. 6C) is formed, the edge 20 of which is aligned with the edge 10, and etching is carried out (FIG. 6D).

Due to the alignment condition of the edge 20 of the mask 40 (which can be an electrode) with that of the topology 4' b, a side 30 of layer 31 is obtained, which is aligned with the corresponding side of the sub-layer 4' b and the mask layer 40.

In other words, said side 30 of the AlN layer 31 is perpendicular to the surface 2' of the substrate 2, or the angle thereof relative to said perpendicular is less than a few degrees, e.g., less than ±15°.

The slope of each side, which extends between a top end $30_1$ and a bottom end $30_2$ is defined by the corresponding top and bottom end pair $30_1$ and $30_2$. Said ends are themselves defined by the edge of the upper area of the step and by the edge of the mask layer 40.

In the two embodiments of FIGS. 5A-5D and 6A-6D:

the upper surface of portions 4a, 4'a, 4b can be elevated in relation to the surface 2', and have a height or thickness of the order of 200 nm, or, more generally speaking, between 10 nm and 1 μm or else between 100 nm and 300 nm, reference 7 designates a possible texturing or germinating layer 7, having the same function as in the previous examples, the nature and/or the thickness of the mask layer 40, 40' can be that of the previous examples, the deposition, etching and alignment techniques can be the same as in the previous examples.

In a method or a device according to the invention, the square sides 30, 32, 34 of the AlN layer are defined by the edges of the growth sub-layers 4, 4' or of the topology 4a, 4'a, 4b formed on the surface of the substrate 2.

The topology or raised surface can be obtained by etching said same layer (case of FIGS. 1A-1D), or by growing said layer on a pre-existing topology (case of FIGS. 2A and 2B), or by etching the substrate 2 (case of FIGS. 5A-6D).

The actual angle of the sides 30, 32, 34 of the AlN layer is obtained by the alignment accuracy of the sides of the sub-layer or sub-layers 4, 4' and the edges of the mask or masks 40, 40'. The slope of each side 30, 32, 34 is defined by an edge of the hard mask 40, 40' and an edge of the growth sub-layer 4, 4' or the topology 4a, 4'a, 4b.

These embodiments further show that, in a single device, it is possible to obtain portions having square sides 30, 32, 34, and one or more portions having one or more inclined sides such as side 36.

In all of the examples presented above:

the etching used for layer 31 is preferably a wet etching operation, e.g., with hot $H_3PO_4$ (at a temperature substantially between 100° C. and 140° C.)

and/or the initial substrate 2 can be a heterogeneous substrate, e.g., of the multilayer type, or else of the homogeneous or solid (or "bulk") type.

All or a part of the mask portions 40, 40' can be eliminated after etching the AlN layer.

Irrespective of the embodiment chosen, the technique presented above enables square sides to be obtained in an AlN layer, without over-etching.

Said technique further enables etchings having small lateral dimensions to be obtained, with fine "gaps" and/or to make one or more straight holes 60 having small dimensions, i.e., to make via holes.

The invention claimed is:

1. A method for producing a layer of AlN having at least one side which is substantially vertical or perpendicular relative to a top surface of a substrate, each side extending between a bottom end and a top end, the top surface of said substrate having a topology comprising at least one step pattern, said method comprising:

depositing the AlN layer, on at least said pattern of the topology, the top end of the step corresponding to the bottom end of said side, forming a mask layer over the AlN layer, at least one edge of which is positioned so as to define the top end of the side, and etching the AlN layer through the mask and stopping at the top surface of the substrate, in order to obtain said side, the slope of the side being defined by the position of said top and bottom edges in a plane substantially perpendicular to the top surface of the substrate.

2. The method according to claim 1, comprising a preliminary step of forming the topology of the substrate, by etching the top surface of the substrate, so as to at least obtain the step pattern.

3. The method according to claim 1, wherein the step has at least one lateral side forming an angle equal to at least 15° relative to the perpendicular to the top surface of the substrate in or on which the step is made.

4. The method according to claim 1, wherein the substrate comprises a sub-layer, one surface of which, together with the top surface of the substrate, forms the step pattern.

5. The method according to claim 4, further comprising obtaining the sub-layer by depositing a uniform layer of material, and by then etching at least said uniform layer of material, in order to obtain the step pattern.

6. The method according to claim 4, further comprising obtaining the sub-layer depositing a layer forming the topology on the top surface of the substrate.

7. The method according to claim 4, wherein at a least a portion of the sub-layer forms an electrode.

8. The method according to claim 4, wherein the sub-layer is made of titanium (Ti) or silicon (Si), or molybdenum (Mo), or platinum (Pt), or silicon nitride.

9. The method according to claim 1, wherein the topology or step pattern or the sub-layer has a thickness of between 10 nm and 1 μm.

10. The method according to claim 1, wherein the etching of the AlN layer comprises a wet etching operation.

11. The method according to claim 1, wherein at least a portion of the mask layer forms an electrode.

12. The method according to claim 1, wherein the AlN layer has a thickness of between 10 nm and 5 μm.

13. The method according to claim 1, wherein the mask layer is made of silica ($SiO_2$), or molybdenum (Mo), or platinum (Pt) or an adhesive resin.

14. The method according to claim 1, wherein the mask layer has a thickness of between 10 nm and 10 μm.

15. The method according to claim 1, further comprising producing an inclined side by etching the AlN layer.

16. The method according to claim 1, further Comprising producing a hole having vertical edges.

17. The method according to claim 1, wherein, in a cross-sectional view, only one side of the mask layer is not aligned with an edge of the step pattern.

18. A method for producing a layer of AlN having at least one side which is substantially vertical or perpendicular relative to a top surface of a substrate, each side extending between a bottom end and a top end, the top surface of said substrate having a topology comprising at least one step pattern, said method comprising:

depositing the AlN layer, on at least said pattern of the topology, the top end of the step corresponding to the bottom end of said side, forming a mask layer over the AlN layer, at least one edge of which is positioned so as to define the top end of the side, and etching the AlN layer through the mask and stopping at the top surface of the substrate, in order to obtain said side, the slope of the side being defined by the position of said top and bottom edges in a plane substantially perpendicular to the top surface of the substrate, wherein the etching of the AlN layer comprises a wet etching operation that results in the at least one side which is substantially vertical or perpendicular relative to the top surface of the substrate.

* * * * *